(12) United States Patent
Abe

(10) Patent No.: US 6,770,560 B2
(45) Date of Patent: Aug. 3, 2004

(54) METHOD OF FORMING METAL WIRING

(75) Inventor: Kazuhide Abe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/444,986

(22) Filed: May 27, 2003

(65) Prior Publication Data

US 2004/0009654 A1 Jan. 15, 2004

(30) Foreign Application Priority Data

Jul. 15, 2002 (JP) .................................. 2002-205073

(51) Int. Cl.[7] .............................................. H01L 21/44
(52) U.S. Cl. ....................... 438/637; 438/653; 438/660; 438/687
(58) Field of Search ........................... 438/637, 643, 438/653, 660, 687, 927

(56) References Cited

U.S. PATENT DOCUMENTS 6,127,256 A * 10/2000 Matsuno ...................... 438/637
6,323,120 B1 * 11/2001 Fujikawa et al. ........... 438/660
6,342,447 B1 * 1/2002 Hoshino ...................... 438/687
6,391,774 B1 * 5/2002 Takewaki .................... 438/687
6,482,741 B1 * 11/2002 Ueno .......................... 438/687

FOREIGN PATENT DOCUMENTS

JP          11-297696         10/1999

* cited by examiner

Primary Examiner—Chandra Chaudhari
(74) Attorney, Agent, or Firm—Volentine Francos, PLLC

(57) ABSTRACT

In a method of manufacturing a semiconductor device, a semiconductor substrate including an insulating layer is provided. A groove is formed on the insulating layer. An additive-containing barrier layer is formed on the insulating layer. A metal seed layer and a metal layer are formed on the barrier layer. Then, the metal layer is subjected to a first heat treatment at a first temperature that is capable of promoting grain growth of the metal seed layer and the metal layer. The barrier layer, the metal seed layer and the metal layer are partially removed so that a conductive layer including the metal seed layer and the metal layer is formed in the groove. Finally, the conductive layer is subjected to a second heat treatment at a second temperature that is higher than the first temperature and allows an additive element in the barrier layer to diffuse into the metal layer.

20 Claims, 15 Drawing Sheets

METHOD OF FORMING METAL WIRING

BACKGROUND OF THE INVENTION

The invention relates to a method of forming a metal layer (for instance, a buried copper (Cu) layer).

In order to improve the electro-migration (EM) resistance of a copper layer in a semiconductor element, a countermeasure to diffuse an impurity element in the copper layer is known. As a method of forming such copper layer, there is a method in which a Cu alloy seed layer is formed on an inner surface of a groove by use of sputtering apparatus, subsequently a copper plating layer is formed by use plating apparatus, thereafter by applying heat treatment, an additive element (that is, an impurity element) in the Cu alloy seed layer is allowed to diffuse into the Cu plating layer.

However, in the above-mentioned method of forming a metal layer, a sample (wafer) thereon the Cu alloy seed layer is formed in the sputtering apparatus is transferred through air exposure to the plating apparatus and there the Cu plating is performed. Accordingly, because of oxidation of the additive element of the Cu alloy seed layer, on a surface of the Cu alloy seed layer an oxidation layer is formed. As a result, there are concerns about deterioration of the adhesion between the Cu alloy seed layer and the Cu plating layer.

Furthermore, the impurity element diffused into the Cu plating layer can work on one hand so as to improve the EM resistance of the Cu plating layer but on the other hand also works so as to suppress grains of the Cu plating layer from growing. Accordingly, since in the Cu plating layer after the heat treatment, there are fine crystallites, there is a problem in that the fine crystallites deteriorate the EM resistance.

SUMMARY OF THE INVENTION

The invention may overcome the problems of the existing technology such as mentioned above and may intend to provide a method of forming a metal layer that allows forming a metal layer excellent in the adhesion and the EM resistance.

In a method of manufacturing a semiconductor device according to the present invention, a semiconductor substrate including an insulating layer is provided. A groove is formed on the insulating layer. An additive-containing barrier layer is formed on the insulating layer. A metal seed layer and a metal layer are formed on the barrier layer. Then, the metal layer is subjected to a first heat treatment at a first temperature that is capable of promoting grain growth of the metal seed layer and the metal layer. The barrier layer, the metal seed layer and the metal layer are partially removed so that a conductive layer including the metal seed layer and the metal layer is formed in the groove. Finally, the conductive layer is subjected to a second heat treatment at a second temperature that is higher than the first temperature and allows an additive element in the barrier layer to diffuse into the metal layer.

DESCRIPTION OF THE PREFERRED EMBODIMENTS

First Embodiment

FIGS. 1A through 1G are process explanatory diagrams showing a method of forming a metal layer according to a first embodiment of the invention.

Figure 1A:
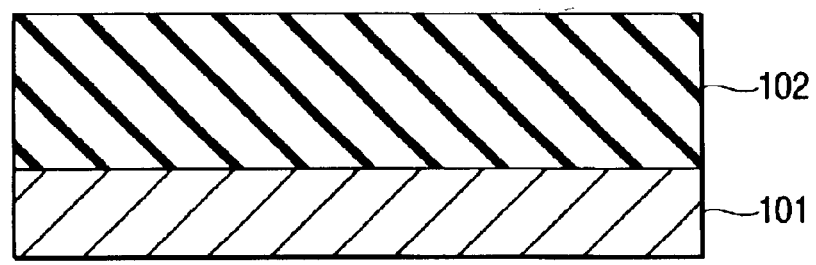
FIGS. 1A through 1G are process explanatory diagrams showing a method of forming a metal layer according to a first embodiment of the invention.

In a method of forming a metal layer according to the first embodiment, firstly, as shown in FIG. 1A, an insulating layer 102 is formed on a semiconductor substrate 101. The semiconductor substrate 101 is constituted of, for instance, silicon. Furthermore, the insulating layer 102 is constituted of, for instance, silicon oxide and so on. However, constituent materials are not restricted to particular ones.

Figure 1B:
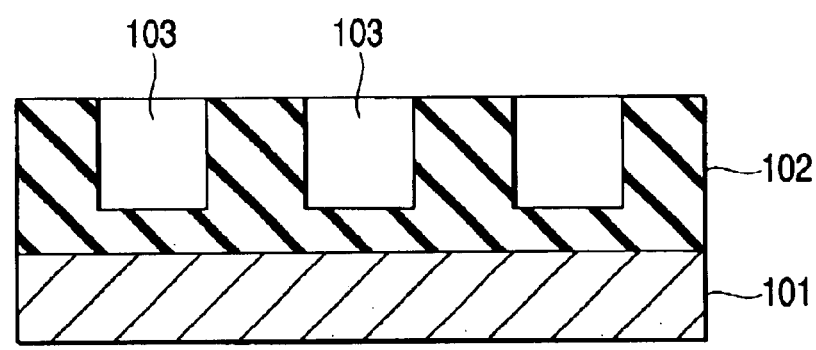

In the next place, as shown in FIG. 1B, by use of known photolithography technology and etching technology, a groove 103 is formed in the insulating layer 102. The groove 103 is formed in a region corresponding to a layer pattern formed in the insulating layer 102. A depth of the groove 103 is, for instance, 0.3 μm, and a width of the groove 103 is, for instance, 0.3 μm. A shape of the groove 103 and the number thereof are not restricted to ones shown in the drawing. Furthermore, dimensions of the groove 103 are neither restricted to ones cited above.

Figure 1C:
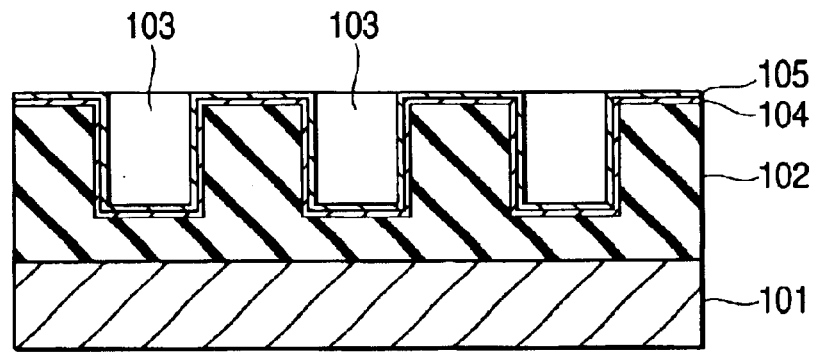

Next, as shown in FIG. 1C, on the insulating layer 102 therein the groove 103 is formed, an additive-containing barrier layer 104 and a Cu seed layer 105 are sequentially formed. The additive-containing barrier layer 104 functions as a diffusion stop layer that inhibits a constituent metal of a layer formed thereon from diffusing into the insulating layer 102. The additive-containing barrier layer 104 is, for instance, a TaMgN layer obtained by adding Mg to TaN. A thickness of the additive-containing barrier layer 104 is, for instance, 40 nm. A thickness of the Cu seed layer 105 is, for instance, 100 nm. However, the dimensions of the respective layers are not restricted to the cited ones.

The additive-containing barrier layer 104 and the Cu seed layer 105 are sequentially formed in the sputtering apparatus (not shown in the drawing) by use of a sputtering method in which the directional characteristics are enhanced. The TaMgN layer as the additive-containing barrier layer 104 is formed, with an Ar/N$_2$ mixture gas introducing into evacuated sputtering apparatus, by use of a TaMg target. The Cu seed layer 105 is formed, with Ar gas introducing into evacuated sputtering apparatus, by use of a Cu target. When thus the Cu seed layer 105 is sequentially formed on the additive-containing barrier layer 104 that is disposed in the evacuated sputtering apparatus, the additive element in the additive-containing barrier layer 104 can be inhibited from being exposed to air and thereby from being oxidized. As the additive element of the additive-containing barrier layer 104, at least one or more of Ag, Ca, Zn, Cd, Au, Be, Mg, Sn, Zr, B, Pd, Al, Hg, In, Ni and Ga can be used. A content (% by weight) of the additive in the additive-containing barrier layer 104 is in the range of 0.05 to 10% by weight. As other examples of the constituent materials of the additive-containing barrier layer 104, TaN, TaCN, TaSiN, TaSiCN, WN, WCN, WSiN, WSiCN, TiN, TiCN, TiSiN, TiSiCN, ZrN, ZrCN, ZrSiN, and ZrSiCN can be cited. As the method of forming the additive-containing barrier layer 104 and the Cu seed layer 105, without restricting to the sputtering method, other methods such as the CVD method can be adopted.

Figure 1D:
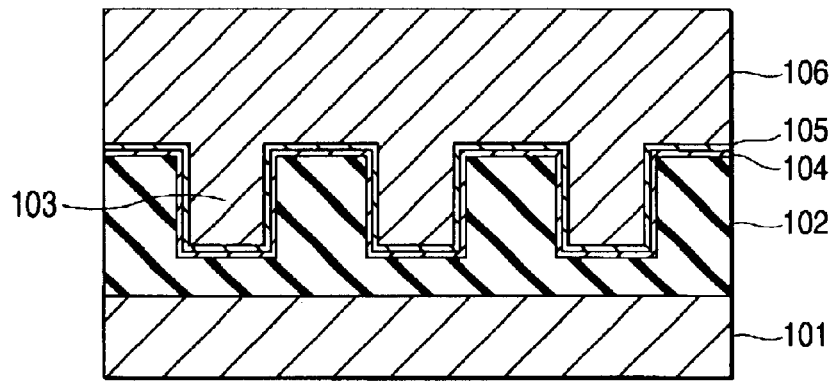

Subsequently, the sample (wafer) thereon the Cu seed layer 105 is formed is taken out of the sputtering apparatus, and while exposing to air, transferred to the plating apparatus (not shown in the drawing). Then, as shown in FIG. 1D, on the Cu seed layer 105, a Cu plating layer 106 is formed by use of an electroplating method. The Cu plating layer 106 is formed so that the groove 103 may be completely buried.

Figure 1E:
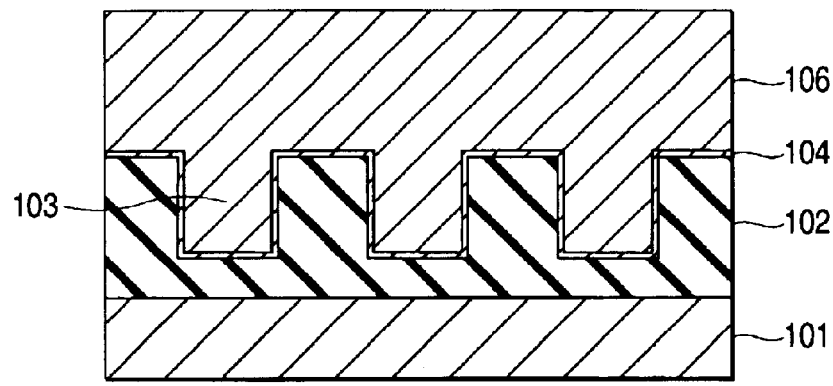

In the next place, in order to stabilize layer qualities such as the hardness, the crystallinity and the specific resistance of the Cu plating layer 106, heat treatment is applied at a first temperature (for instance, 100 to 350 degree centigrade) for 1 min to 5 hr in nitrogen atmosphere. However, the most preferable heat treatment temperature is different depending on various kinds of factors such as a width of the layer and so on. In the first embodiment, in order to make the diffusion of the additive element from the additive-containing barrier layer 104 to the Cu seed layer 105 and the Cu plating layer 106 as small as possible, the heat treatment is carried out at a relatively low temperature, and in order to grow Cu grains of the Cu seed layer 105 and the Cu plating layer 106 the heat treatment is performed for a relatively longer time period. According to the heat treatment, as shown in FIG. 1E, the Cu seed layer 105 and the Cu plating layer 106 are promoted in integrating.

Figure 1F:
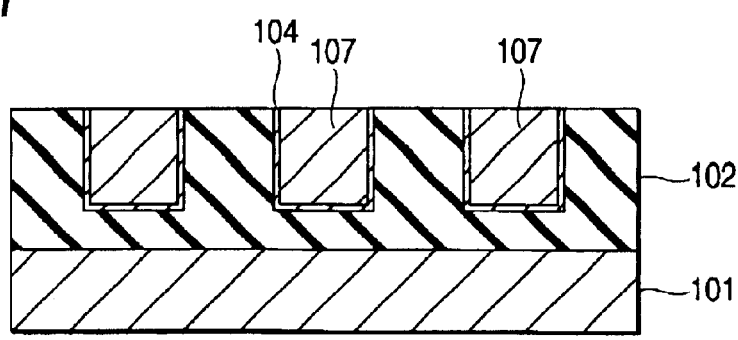

Subsequently, as shown in FIG. 1F, the respective layers on the insulating layer 102, that is, the additive-containing barrier layer 104, the Cu seed layer 105 and the Cu plating layer 106 are partially removed until a top portion of the insulating layer 102 is exposed. The removing is performed according to a CMP polishing method by use of CMP (chemical-mechanical polishing) apparatus (not shown in the drawing). According to the process, a conductive layer 107 (constituted of part of the Cu seed layer 105 and part of the Cu plating layer 106) is left in the groove 103. The conductive layer 107 becomes a metal layer of a semiconductor element.

Slurry used in the CMP method is silica-based one and mixed with $H_2O_2$ as an oxidant. Respective down forces of a carrier (a system that holds a wafer to be polished) and a retainer ring (a member that surrounds an outer periphery of the wafer held by the carrier) of the CMP apparatus are, for instance, 4 psi and 5 psi. Furthermore, respective rotation speeds of the carrier and a platen (polishing cloth for polishing a sample held by the carrier) of the CMP apparatus are, for instance, 80 rpm and 80 rpm.

The polishing process of the CMP method comprises two steps. In the first polishing step, the Cu plating layer 106 and the Cu seed layer 105 are polished and the additive-containing barrier layer 104 on the insulating layer 102 is left. In the subsequent second polishing step, by use of a different silica-based slurry, the additive-containing barrier layer 104 disposed on a top portion of the insulating layer 102 is completely removed. When a polishing speed of the Cu plating layer 106 is set at, for instance, one tenth that of the additive-containing barrier layer 104, the conductive layer 107 can be suppressed from dishing. At this time, the down forces of the carrier and the retainer ring of the CMP apparatus are, for instance, 4 psi and 5 psi, respectively. Furthermore, the rotation speeds of the carrier and the platen of the CMP apparatus are, for instance, 50 rpm and 50 rpm, respectively.

Figure 1G:
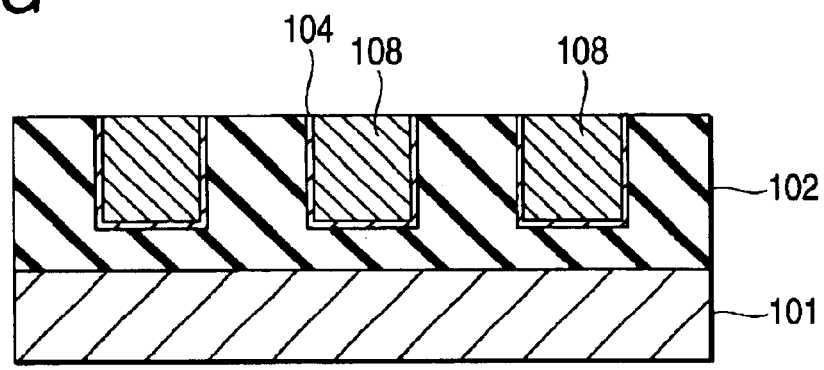

In the next place, as shown in FIG. 1G, heat treatment is carried out at a second temperature (for instance, in the neighborhood of 400 degree centigrade) for 0.5 to 5 hr in a mixture atmosphere of nitrogen and hydrogen. In the heat treatment, the additive element in the additive-containing barrier layer 104 is diffused into the conductive layer 107 and thereby an additive-containing conductive layer 108 is formed. Accordingly, the second temperature is higher than the first temperature. Furthermore, the second temperature, without restricting to the neighborhood of 400 degree centigrade, can be a temperature in the range of 250 to 450 degree centigrade. Owing to the heat treatment, the additive element in the additive-containing barrier layer 104 is allowed diffusing into the conductive layer 107, and thereby the additive-containing conductive layer 108 is formed. In the above, the formation of the Cu layer in the semiconductor element comes to completion.

As mentioned above, according to the method of forming a metal layer according to the first embodiment, after the Cu seed layer 105 is formed in the sputtering apparatus, the sample is transferred through air to the plating apparatus. Accordingly, the additive-containing barrier layer 104 is not exposed to air. As a result, the additive element of the additive-containing barrier layer 104 is not oxidized with the air, and thereby the Cu plating layer 106 can be inhibited from deteriorating in the adhesion.

Furthermore, according to the method of forming a metal layer according to the first embodiment, in order to promote grain growth of the Cu seed layer 105 and the Cu plating layer 106, the heat treatment is carried out at the first temperature that is relatively low, and thereafter at the relatively higher second temperature that enables the additive element to diffuse from the additive-containing barrier layer 104 to the conductive layer 107, the heat treatment is implemented. Thus, according to the method of forming a metal layer according to the first embodiment, since the grain growth and the diffusion of the additive element that are two countermeasure for improving the EM resistance can be implemented, the Cu layer excellent in the EM resistance can be formed.

In the above explanation, the method of forming a Cu layer to a semiconductor element is explained. However, the invention can be applied also to a method of forming a metal layer other than the Cu layer.

Second Embodiment

FIGS. 2A through 2G are process explanatory diagrams showing a method of forming a metal layer according to the second embodiment of the invention. The method of forming a metal layer according to the second embodiment is different from that according to the first embodiment in that a barrier layer 204 is provided between an insulating layer 202 and an additive-containing barrier layer 205. Here, the barrier layer 204 is either a barrier layer that does not contain an additive or a barrier layer whose additive content is smaller than that of the additive-containing barrier layer 205.

Figure 2A:
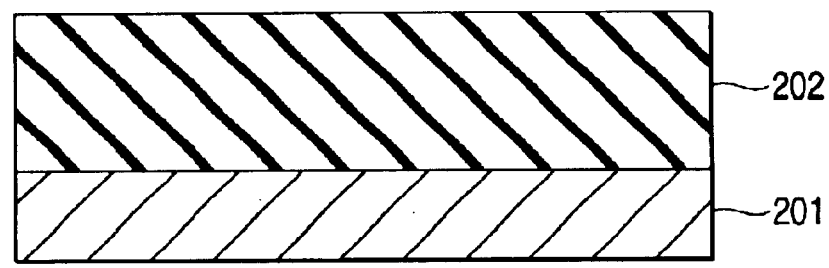
FIGS. 2A through 2G are process explanatory diagrams showing a method of forming a metal layer according to a second embodiment of the invention.

In a method of forming a metal layer according to the second embodiment, firstly, as shown in FIG. 2A, an insulating layer 202 is formed on a semiconductor substrate 201. The semiconductor substrate 201 is constituted of, for instance, silicon. Furthermore, the insulating layer 202 is constituted of, for instance, silicon oxide and so on. However, the constituent materials are not restricted to particular ones.

Figure 2B:
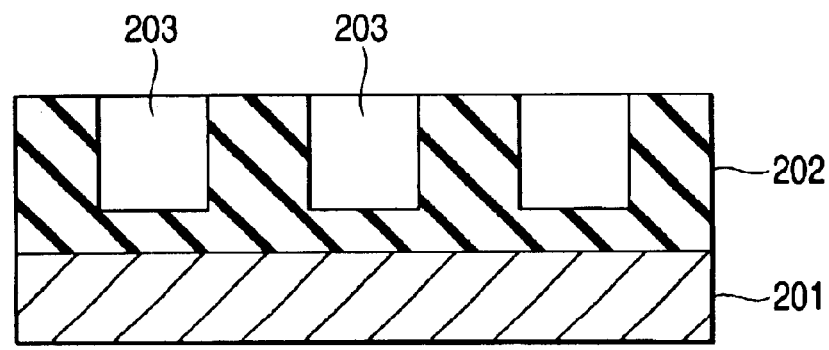

In the next place, as shown in FIG. 2B, by use of known photolithography technology and etching technology, a groove 203 is formed in the insulating layer 202. The groove 203 is formed in a region corresponding to a layer pattern formed in the insulating layer 202. A depth of the groove 203 is, for instance, 0.3 $\mu$m, and a width of the groove 203 is, for instance, 0.3 $\mu$m. A shape of the groove 203 and the number thereof are not restricted to ones shown in the drawing. Furthermore, dimensions of the groove 203 are neither restricted to one cited above.

Figure 2C:
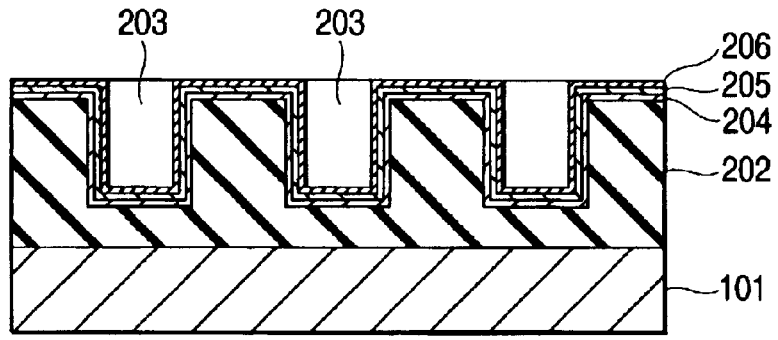

Next, as shown in FIG. 2C, on the insulating layer 202 therein the groove 203 is formed, a barrier layer 204, a additive-containing barrier layer 205 and a Cu seed layer 206 are sequentially formed. The barrier layer 204 and the additive-containing barrier layer 205 work as a diffusion stop layer that inhibits a constituent metal of a layer formed thereon from diffusing into the insulating layer 202. The barrier layer 204 is formed by use of one material selected from a group of TaN, TaCN, TaSiN, TaSiCN, WN, WCN, WSiN, WSiCN, TiN, TiCN, TiSiN, TiSiCN, ZrN, ZrCN, ZrSiN and ZrSiCN. The additive-containing barrier layer 205 is formed by use of a material in which one material selected from a group of TaN, TaCN, TaSiN, TaSiCN, WN, WCN, WSiN, WSiCN, TiN, TiCN, TiSiN, TiSiCN, ZrN, ZrCN, ZrSiN and ZrSiCN is mixed with at least one or more additive elements selected from Ag, Ca, Zn, Cd, Au, Be, Mg, Sn, Zr, B, Pd, Al, Hg, In, Ni and Ga.

The barrier layer 204, the additive-containing barrier layer 205 and the Cu seed layer 206 are sequentially formed in the sputtering apparatus by use of a sputtering method in which the directional characteristics are enhanced. As the method of depositing the barrier layer 204, the additive-containing barrier layer 205 and the Cu seed layer 206, without restricting to the sputtering method, other methods such as the CVD method can be adopted.

Figure 2D:
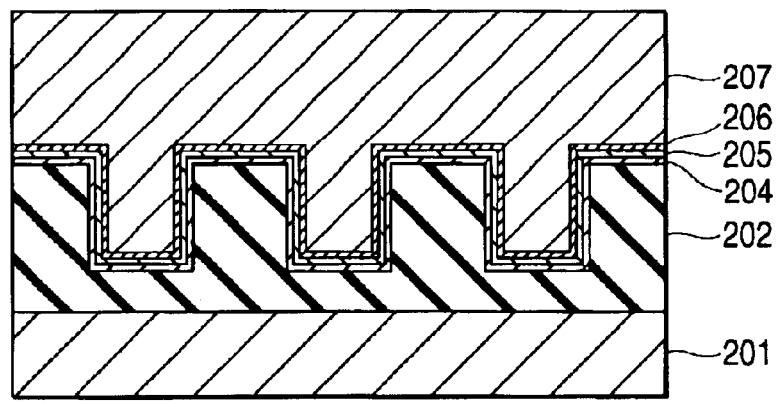

Subsequently, the sample (wafer) thereon the Cu seed layer 206 is formed is taken out of the sputtering apparatus, while exposing to air, transferred to the plating apparatus (not shown in the drawing). Then, as shown in FIG. 2D, on the Cu seed layer 206, a Cu plating layer 207 is formed by use of an electroplating method. The Cu plating layer 207 is formed so that the groove 203 may be completely buried.

Figure 2E:
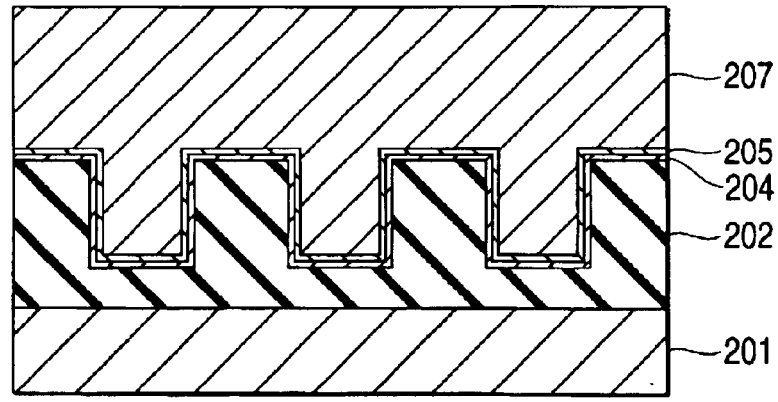

In the next place, with an intension of stabilizing layer qualities such as the hardness, the crystallinity and the specific resistance of the Cu plating layer 207, the heat treatment is carried out at a first temperature (for instance, 100 to 350 degree centigrade) for 1 min to 5 hr in nitrogen atmosphere. Owing to the heat treatment, as shown in FIG. 2E, the Cu seed layer 206 and the Cu plating layer 207 are promoted in integrating.

Figure 2F:
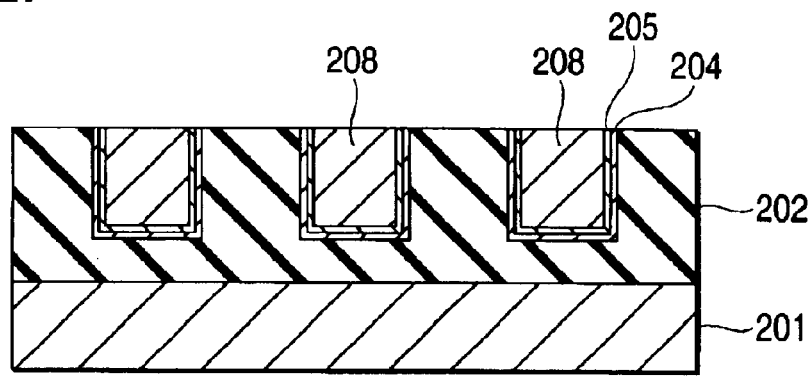

Subsequently, as shown in FIG. 2F, the respective layers on the insulating layer 202, that is, the barrier layer 204, the additive-containing barrier layer 205, the Cu seed layer 206 and the Cu plating layer 207 are partially removed until a top portion of the insulating layer 202 is exposed. The removing is performed according to a CMP polishing method. According to the process, a conductive layer 208 (constituted of part of the Cu seed layer 206 and part of the Cu plating layer 207) is left in the groove 203. The conductive layer 208 is used as a metal layer of a semiconductor element.

Figure 2G:
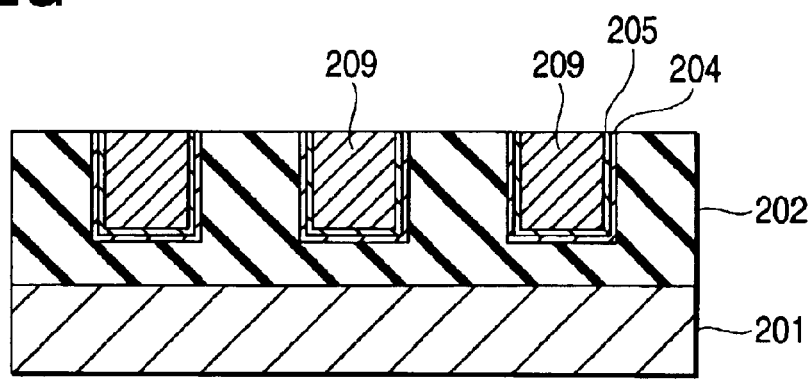

In the next place, as shown in FIG. 2G, heat treatment is carried out at a second temperature (for instance, in the neighborhood of 400 degree centigrade) for 0.5 to 5 hr in a mixture atmosphere of nitrogen and hydrogen. In the heat treatment, the additive element in the additive-containing barrier layer 205 is diffused into the conductive layer 208 and thereby an additive-containing conductive layer 209 is formed. Accordingly, the second temperature is set higher than the first temperature. Furthermore, the second temperature, without restricting to the neighborhood of 400 degree centigrade, can be a temperature in the range of 250 to 450 degree centigrade. Owing to the heat treatment, the additive element in the additive-containing barrier layer 205 is allowed to diffuse into the conductive layer 208, and thereby the additive-containing conductive layer 209 is formed. In the above, the formation of the Cu layer in the semiconductor element comes to completion.

As mentioned above, according to the method of forming a metal layer according to the second embodiment, after the Cu seed layer 206 is formed in the sputtering apparatus, the sample is transferred through air to the plating apparatus. Accordingly, the additive-containing barrier layer 205 is not exposed to the air. As a result, the additive element of the additive-containing barrier layer 205 is not oxidized with the air, and the Cu plating layer 207 can be inhibited from deteriorating in the adhesion and from generating voids when the Cu plating layer 207 is formed.

Furthermore, according to the method of forming a metal layer according to the second embodiment, in order to promote growing grains of the Cu seed layer 206 and the Cu plating layer 207, the heat treatment is carried out at the first temperature that is relatively low, and thereafter at the relatively higher second temperature that enables the additive element to diffuse from the additive-containing barrier layer 205 to the conductive layer 208, the heat treatment is implemented. Thus, according to the method of forming a metal layer according to the second embodiment, since the grain growth and the diffusion of the additive element that are two countermeasure for improving the EM resistance can be implemented, the Cu layer excellent in the EM resistance can be formed.

Furthermore, in the method of forming the metal layer according to the second embodiment, as an under layer of the additive-containing barrier layer 205, the barrier layer 204 is provided. Accordingly, an effect that inhibits the Cu element from diffusing into the insulating layer 202 can be furthermore enhanced.

Except for the above, the second embodiment is the same as the first embodiment.

Third Embodiment

FIGS. 3A through 3J are process explanatory diagrams showing a method of forming a metal layer according to a third embodiment of the invention.

Figure 3A:
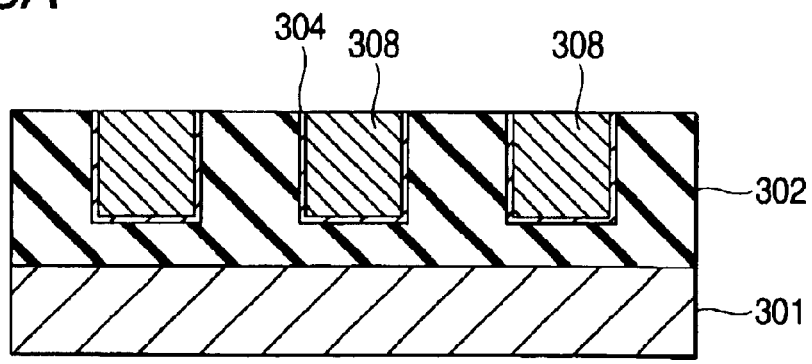
FIGS. 3A through 3J are process explanatory diagrams showing a method of forming a metal layer according to a third embodiment of the invention.

A method of forming a metal layer according to the third embodiment is one in which a metal layer is formed on a sample (wafer) provided with a conductive layer 308 such as shown in FIG. 3A. In FIG. 3A, reference numerals 301, 302 and 304 denote a semiconductor substrate, an insulating layer and a barrier layer, respectively. The sample shown in FIG. 3A may be whatever samples provided with a metal layer. Furthermore, the sample shown in FIG. 3A may be one that is formed according to the first or second embodiment.

Figure 3B:
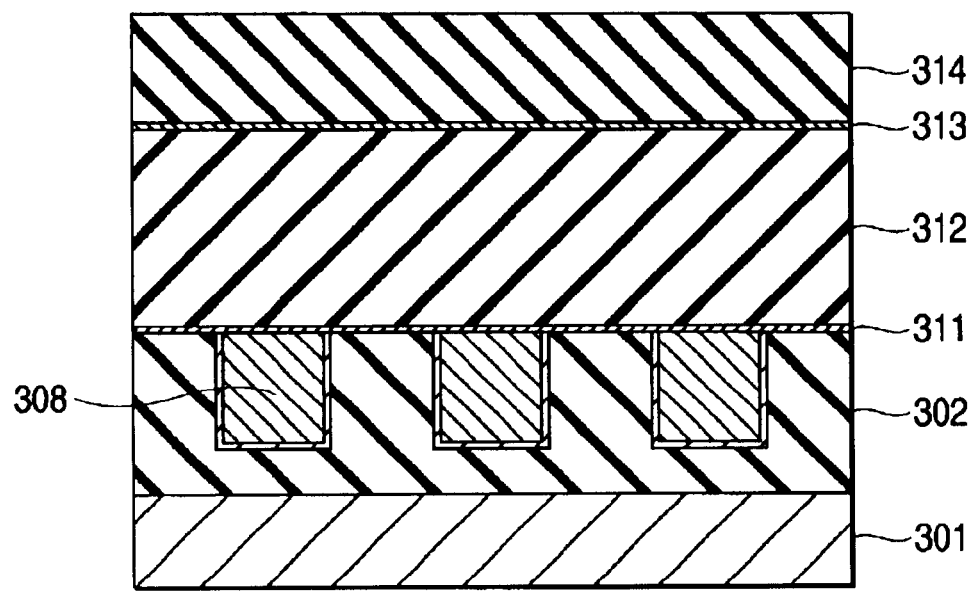

In the method of forming a metal layer according to the third embodiment, as shown in FIG. 3B, on the insulating layer 302 provided with the conductive layer 308, a SiN layer 311 as a cap layer, an insulating layer 312, a SiN layer 313 as an etch stop layer, and an insulating layer 314 are sequentially formed. The insulating layer 312 and the insulating layer 314 are formed of, for instance, silicon oxide. The SiN layer 311 has a function of inhibiting the insulating layer 312 from oxidizing the conductive layer 308. However, constituent materials are not restricted to these.

Figure 3C:
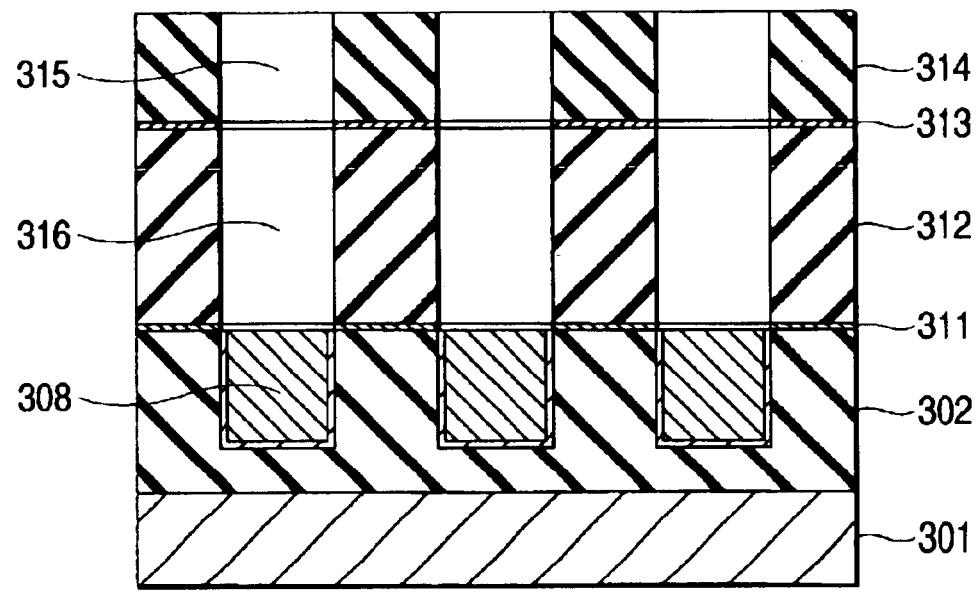

Subsequently, as shown in FIG. 3C, by use of known photolithography technology and etching technology, a groove 315 is formed in the insulating layer 314, and at a lower portion of the groove 315, a via 316 that penetrates through the SiN layer 313, the insulating layer 312, and the cap layer 311 and thereby exposes the conductive layer 308 is formed. The groove 315 is divided into regions corresponding to layer patterns formed in the insulating layer 312. A depth of the groove 315 is, for instance, 0.3 µm, and a width of the groove 315 is, for instance, 0.3 µm. Furthermore, a depth of the via 316 is, for instance, 0.8 µm, and a diameter of the via 316 is, for instance, 0.3 µm. Shapes of the groove 315 and the via 316 and the numbers thereof are not restricted to ones shown in the drawing. Furthermore, dimensions of the groove 315 and the via 316 are neither restricted to ones cited above.

Figure 3D:
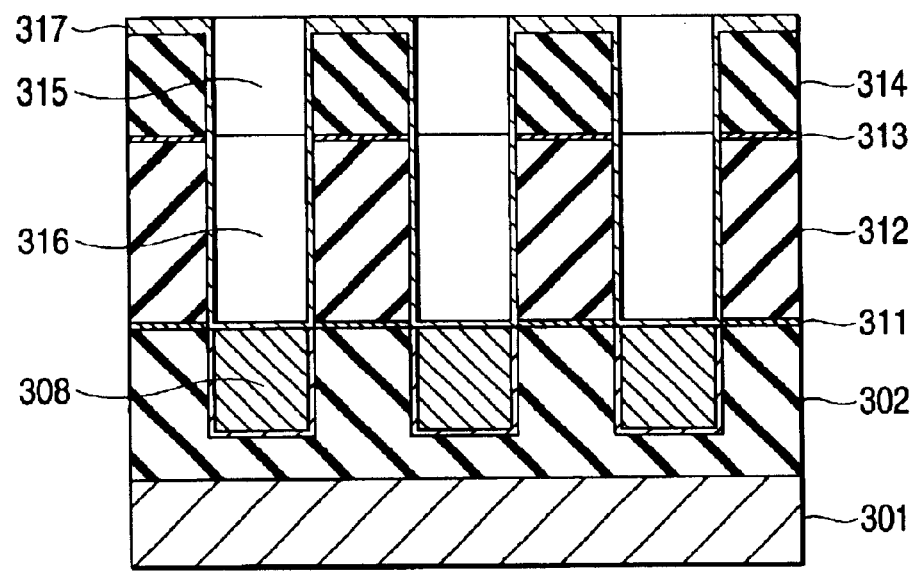

Next, as shown in FIG. 3D, on a side surface of the groove 315 of the insulating layer 314 as well as on a side surface and a bottom surface of the via 316, an additive-containing barrier layer 317 is formed. The additive-containing barrier layer 317 functions as a diffusion stop layer that inhibits a constituent metal of a layer formed thereon from diffusing into the insulating layers 312 and 314. The additive-containing barrier layer 317 is, for instance, a TaMgN layer obtained by adding Mg to TaN. A thickness of the additive-containing barrier layer 317 is, for instance, 80 nm (a thickness of a deposition layer above the insulating layer 314). However, the dimensions are not restricted to the cited ones.

The additive-containing barrier layer 317 is formed in the sputtering apparatus (not shown in the drawing) by use of a sputtering method in which the directional characteristics are enhanced. The TaMgN layer as the additive-containing barrier layer 317 is formed, with an Ar/$N_2$ mixture gas introducing into evacuated sputtering apparatus, by use of a TaMg target. As the additive element of the additive-containing barrier layer 317, at least one or more of Ag, Ca, Zn, Cd, Au, Be, Mg, Sn, Zr, B, Pd, Al, Hg, In, Ni and Ga can be used. A content (% by weight) of the additive in the additive-containing barrier layer 317 is in the range of 0.05 to 10% by weight. As other examples of the constituent materials of the additive-containing barrier layer 317, TaN, TaCN, TaSiN, TaSiCN, WN, WCN, WSiN, WSiCN, TiN, TiCN, TiSiN, TiSiCN, ZrN, ZrCN, ZrSiN, and ZrSiCN can be cited. As the method of depositing the additive-containing barrier layer 317, without restricting to the sputtering method, other methods such as the CVD method can be adopted.

Figure 3E:
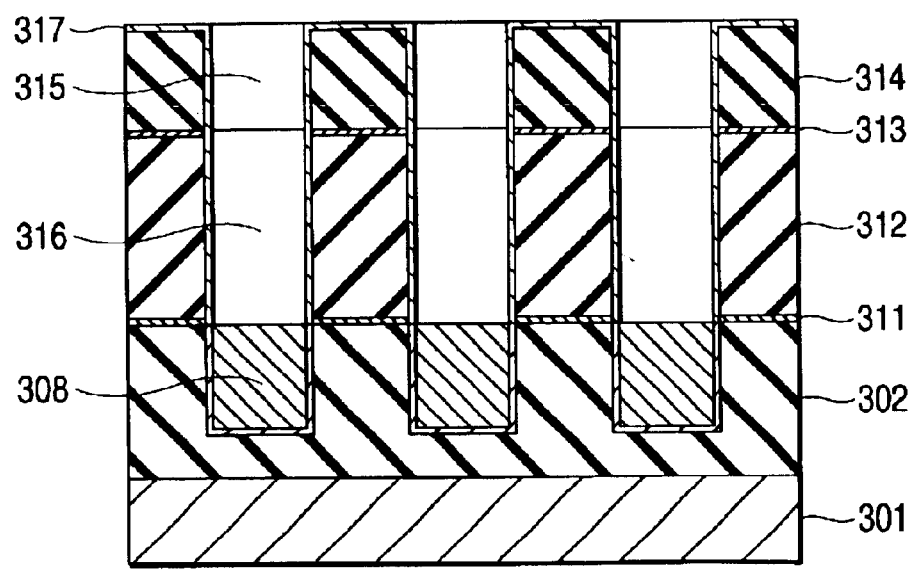

Subsequently, as shown in FIG. 3E, the additive-containing barrier layer 317 on the bottom surface of the via 316, without exposing the sample to the air, is removed by use of anisotropic etching. For instance, when the additive-containing barrier layer 317 is deposited by 80 nm, a layer thickness at a bottom portion of the via 316 is substantially 15 nm, and a film thickness of a sidewall portion of the via 316 is substantially 4 nm. Accordingly, when the additive-containing barrier layer 317 on the bottom portion of the via 316 is removed, the additive-containing barrier layer 317 on the sidewall portion of the via 316 and an external portion of the groove 315 (a top portion of the insulating layer 314) can be left.

Figure 3F:
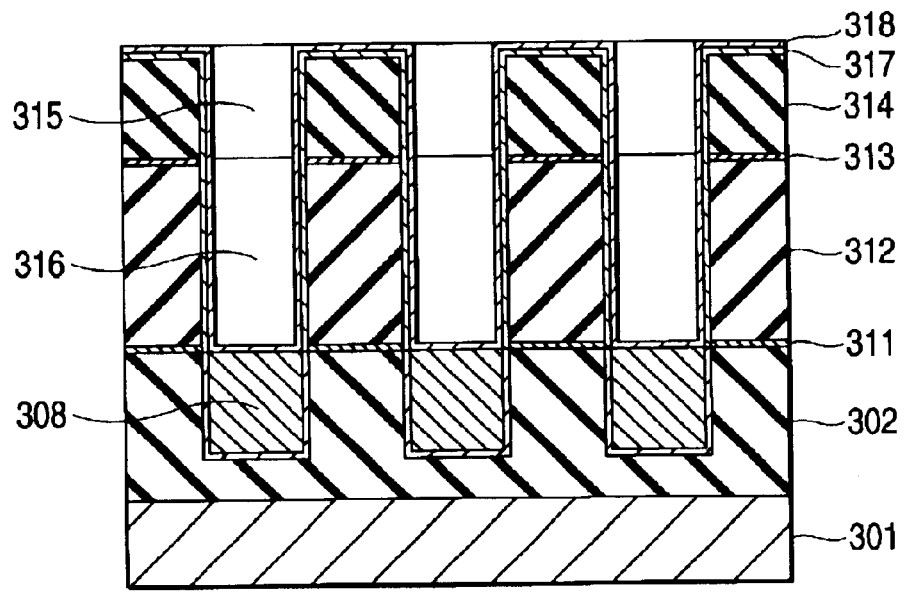

In the next place, after the additive-containing barrier layer 317 on the bottom portion of the via 316 is removed, without exposing the sample to the air, as shown in FIG. 3F, a Cu seed layer 318 is formed. Since the additive-containing barrier layer 317 on the bottom portion of the via 316 is removed, the Cu seed layer 318 is directly connected to the conductive layer 308 that is a lower layer.

Figure 3G:
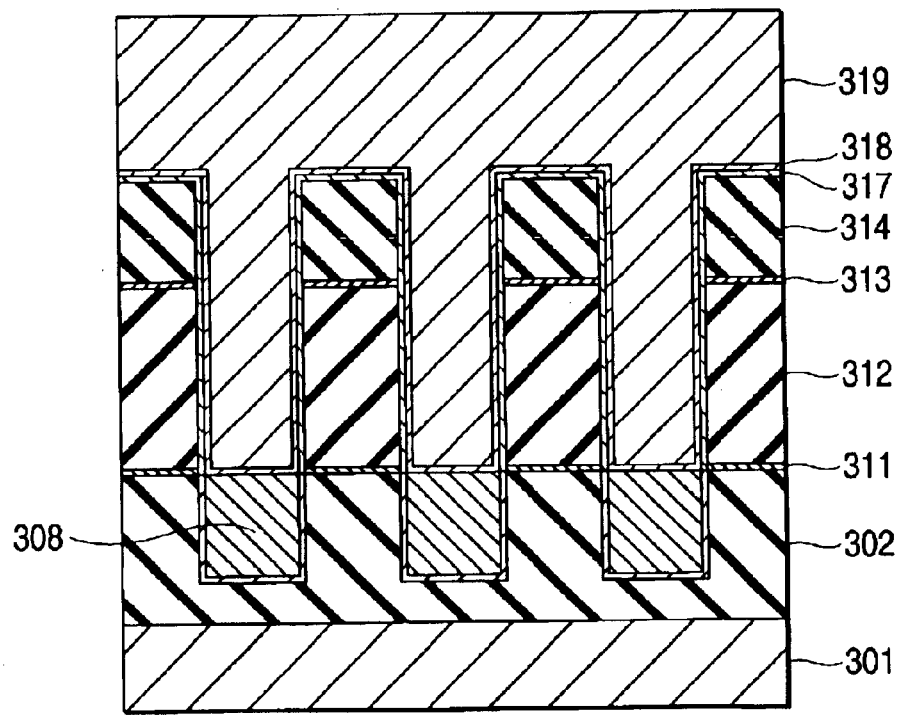

Subsequently, the wafer thereon the Cu seed layer 318 is formed is taken out of the sputtering apparatus, and while exposing to air, transferred to the plating apparatus. Then, as shown in FIG. 3G, on the Cu seed layer 318, a Cu plating layer 319 is formed by use of an electroplating method. The Cu plating layer 319 is formed so that the via 316 and the groove 315 may be completely buried.

Figure 3H:
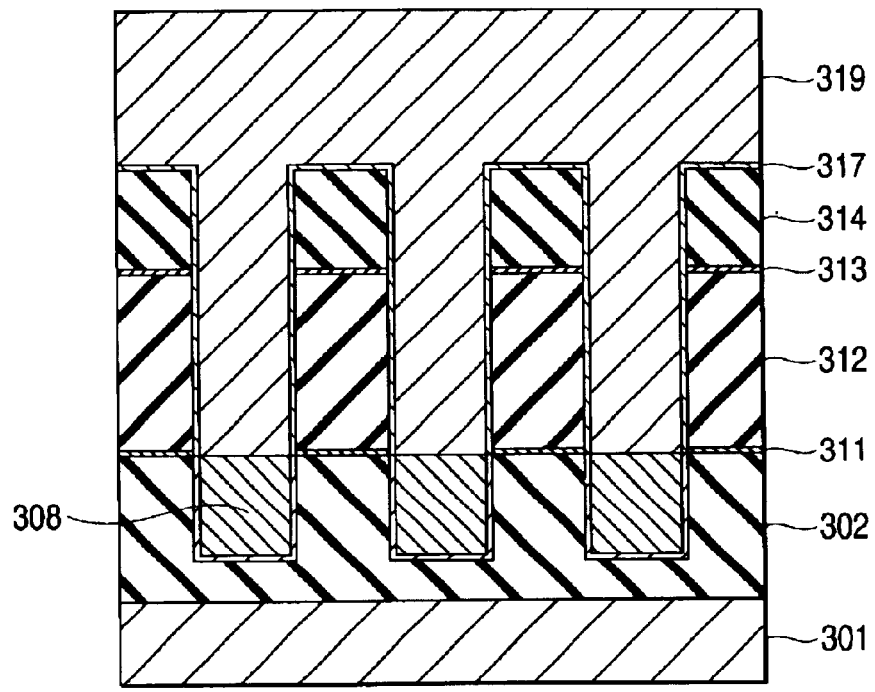

In the next place, in order to stabilize layer qualities such as the hardness, the crystallinity and the specific resistance of the Cu plating layer 319, heat treatment is carried out at a first temperature (for instance, 100 to 350 degree centigrade) for 1 min to 5 hr in nitrogen atmosphere. However, the most preferable heat treatment temperature is different depending on a width of the layer. Furthermore, the most preferable heat treatment time period is different depending on a width of the layer. In the third embodiment, in order to make the diffusion of the additive element from the additive-containing barrier layer 317 to the Cu seed layer 318 and the Cu plating layer 319 as small as possible, the heat treatment is carried out at a relatively low temperature, and in order to grow Cu grains of the Cu seed layer 318 and the Cu plating layer 319 the heat treatment is performed for a relatively longer time period. According to the heat treatment, as shown in FIG. 3H, the Cu seed layer 318 and the Cu plating layer 319 are promoted in integrating.

Figure 3I:
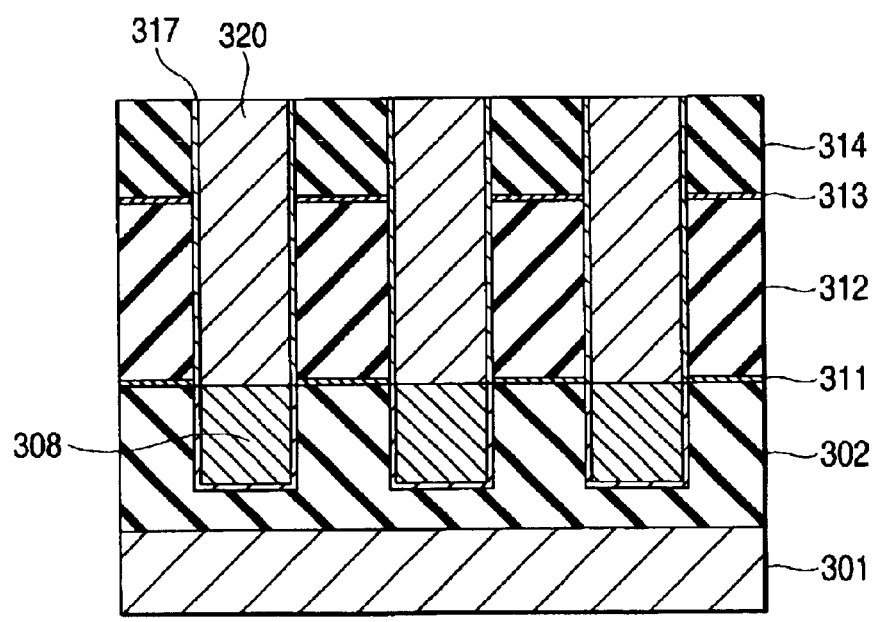

Subsequently, as shown in FIG. 3I, the respective layers on the insulating layer 314, that is, the additive-containing barrier layer 317, the Cu seed layer 318, and the Cu plating layer 319 are partially removed until a top portion of the insulating layer 314 is exposed. The removing is performed according to the CMP polishing method. According to the process, a conductive layer 320 (constituted of part of the Cu seed layer 318 and part of the Cu plating layer 319) is left in the groove 315 and the via 316. The conductive layer 320 is used as a metal layer of a semiconductor element. The CMP method is similar to one in the first embodiment.

Figure 3J:
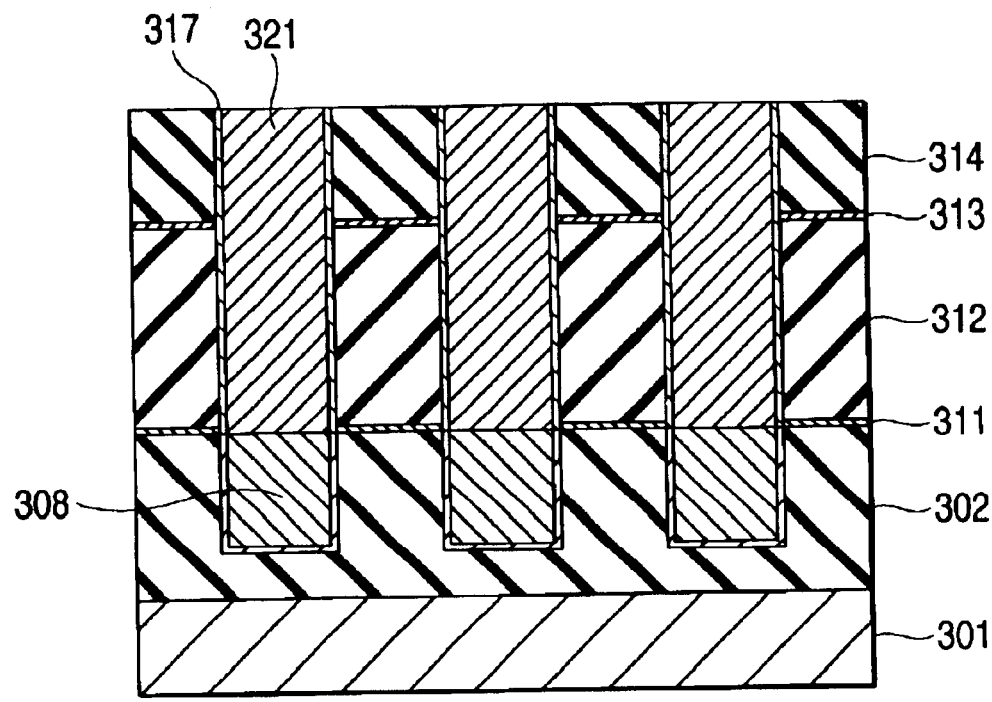

In the next place, as shown in FIG. 3J, heat treatment is carried out at a second temperature (for instance, in the neighborhood of 400 degree centigrade) for 0.5 to 5 hr in an atmosphere of a mixture gas of nitrogen and hydrogen. In the heat treatment, the additive element in the additive-containing barrier layer 317 is diffused into the conductive layer 320 and thereby an additive-containing conductive layer 321 is formed. Accordingly, the second temperature is set higher than the first temperature. Furthermore, the second temperature, without restricting to the neighborhood of 400 degree centigrade, can be a temperature in the range of 250 to 450 degree centigrade. Owing to the heat treatment, the additive element in the additive-containing barrier layer 317 is allowed to diffuse into the conductive layer 320, and thereby the additive-containing conductive layer 321 is formed. In the above, the formation of the Cu layer in the semiconductor element comes to completion.

As mentioned above, according to the method of forming a metal layer according to the third embodiment, after the Cu seed layer 318 is formed in the sputtering apparatus, the wafer is transferred through air to the plating apparatus. Accordingly, the additive-containing barrier layer 317 is not exposed to air. As a result, the additive element of the additive-containing barrier layer 317 is not oxidized with the air and the Cu plating layer 319 can be inhibited from deteriorating in the adhesion.

Furthermore, according to the method of forming a metal layer according to the third embodiment, in order to promote grain growth in the Cu seed layer 318 and the Cu plating layer 319, the heat treatment is carried out at the first temperature that is relatively low, and thereafter at the relatively higher second temperature that enables the additive element to diffuse from the additive-containing barrier layer 317 to the conductive layer 320, the heat treatment is implemented. Thus, according to the method of forming a metal layer according to the third embodiment, since the grain growth and the diffusion of the additive element that are two countermeasure for improving the EM resistance can be implemented, the Cu layer excellent in the EM resistance can be formed.

Furthermore, since the conductive layer 308 that is a first conductive layer and a second conductive layer 321 are directly connected through the via 316, the layer low in the resistance can be formed, that is, a layer configuration preferable for improving an operation speed of the semiconductor element is obtained.

Still furthermore, in the above explanation, the method of forming a Cu layer to a semiconductor element is explained. However, the invention can be applied also to a method of forming the metal layer other than the Cu layer.

Fourth Embodiment

FIGS. 4A through 4J are process explanatory diagrams showing a method of forming a metal layer according to the fourth embodiment of the invention. The method of forming a metal layer according to the fourth embodiment is different from that according to the third embodiment in that a barrier layer 417 is provided between insulating layers 412, 414 and an additive-containing barrier layer 418. Here, the barrier layer 417 is either a barrier layer that does not contain an additive or a barrier layer whose additive content is smaller than that of the additive-containing barrier layer 418.

Figure 4A:
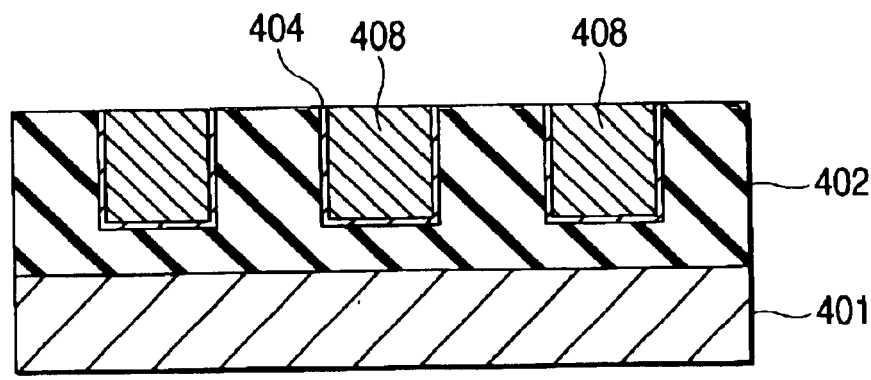
FIGS. 4A through 4J are process explanatory diagrams showing a method of forming a metal layer according to a fourth embodiment of the invention.

A method of forming a metal layer according to the fourth embodiment is one in which a metal layer is formed on a sample (wafer) provided with a conductive layer 408 such as shown in FIG. 4A. In FIG. 4A, reference numerals 401, 402 and 404 denote a semiconductor substrate, an insulating layer, and a barrier layer, respectively. The sample shown in FIG. 4A may be any one of samples that are provided with a metal layer. Furthermore, the sample shown in FIG. 4A may be either one that is formed according to the first embodiment or one that is formed according to the second embodiment.

Figure 4B:
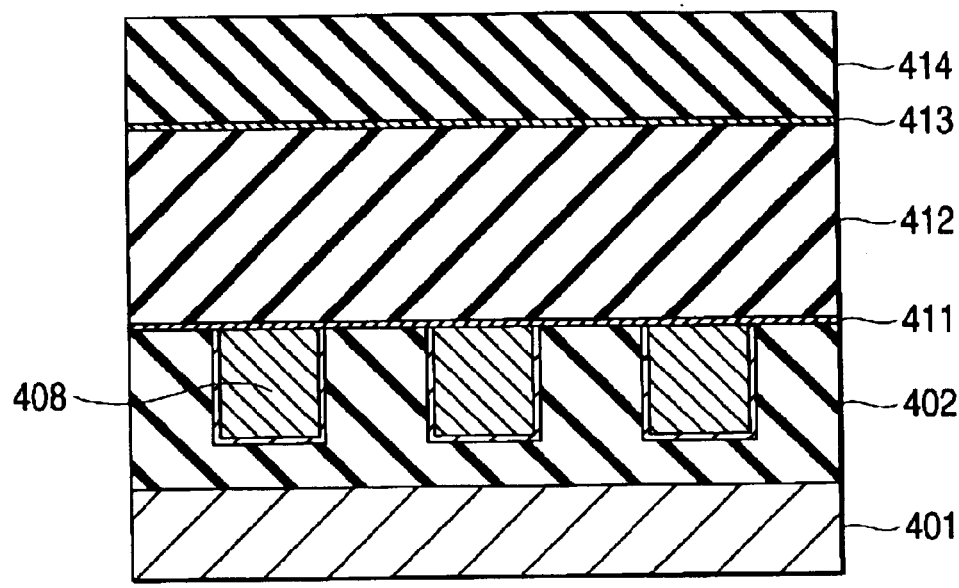

In the method of forming a metal layer according to the fourth embodiment, as shown in FIG. 4B, on the insulating layer 402 provided with the conductive layer 408, a SiN layer 411 as a cap layer, the insulating layer 412, a SiN layer 413 as an etch stop layer, and an insulating layer 414 are sequentially formed. The insulating layers 412 and 414 are constituted of, for instance, silicon oxide. The SiN layer 411 has a function of inhibiting the insulating layer 412 from oxidizing the conductive layer 408. However, constituent materials are not restricted to these.

Figure 4C:
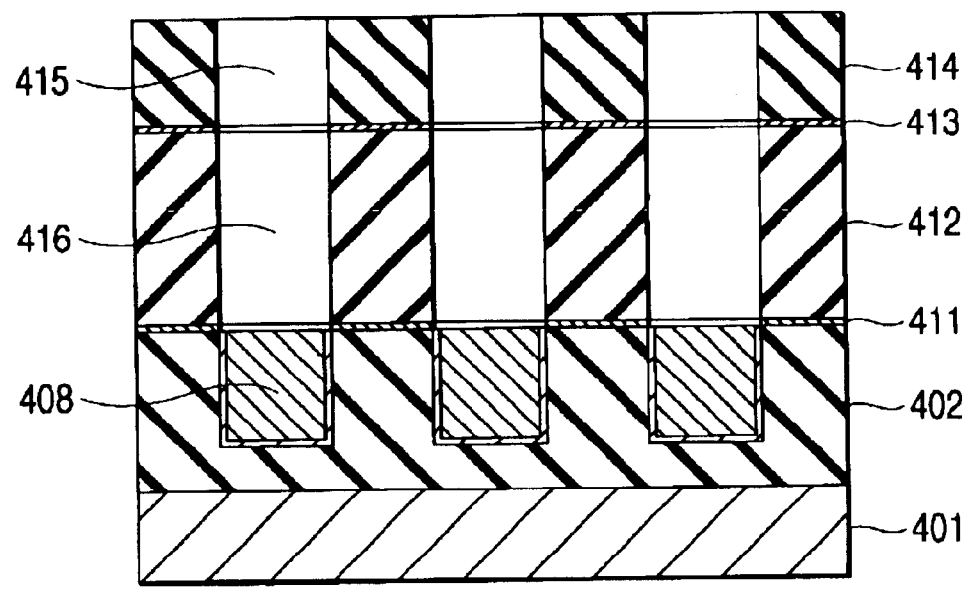

In the next place, as shown in FIG. 4C, by use of known photolithography technology and etching technology, a groove 415 is formed in the insulating layer 414, and at a lower portion of the groove 415 a via 416 that penetrates through the SiN layer 413, the insulating layer 412, and the cap layer 411 and thereby exposes the conductive layer 408 is formed. Shapes and the sizes of the groove 415 and the via 416 are the same as that of the third embodiment.

Figure 4D:
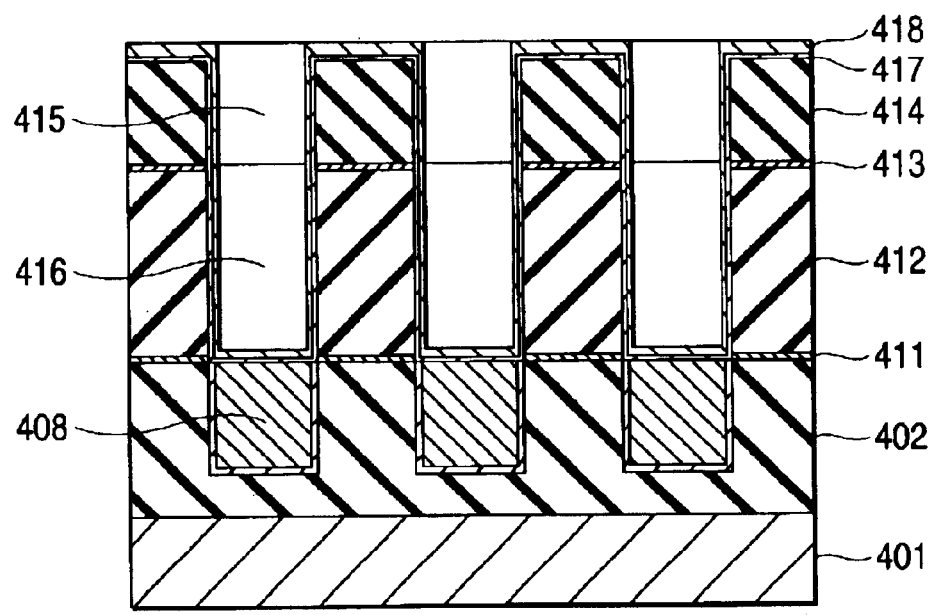

Next, as shown in FIG. 4D, on a side surface of the groove 415 of the insulating layer 414, as well as on a side surface and on a bottom surface of the via 416, the barrier layer 417 and the additive-containing barrier layer 418 are sequentially formed. The barrier layer 417 and the additive-containing barrier layer 418 work as a diffusion stop layer that inhibits a constituent metal of a layer formed thereon from diffusing into the insulating layers 412 and 414. The barrier layer 417 is formed by use of one material selected from a group of, for instance, TaN, TaCN, TaSiN, TaSiCN, WN, WCN, WSiN, WSiCN, TiN, TiCN, TiSiN, TiSiCN, ZrN, ZrCN, ZrSiN, and ZrSiCN. The additive-containing barrier layer 418 is formed by use of a material in which one material selected from a group of TaN, TaCN, TaSiN, TaSiCN, WN, WCN, WSiN, WSiCN, TiN, TiCN, TiSiN, TiSiCN, ZrN, ZrCN, ZrSiN and ZrSiCN is mixed with at least one or more additive elements selected from Ag, Ca, Zn, Cd, Au, Be, Mg, Sn, Zr, B, Pd, Al, Hg, In, Ni and Ga.

Figure 4E:
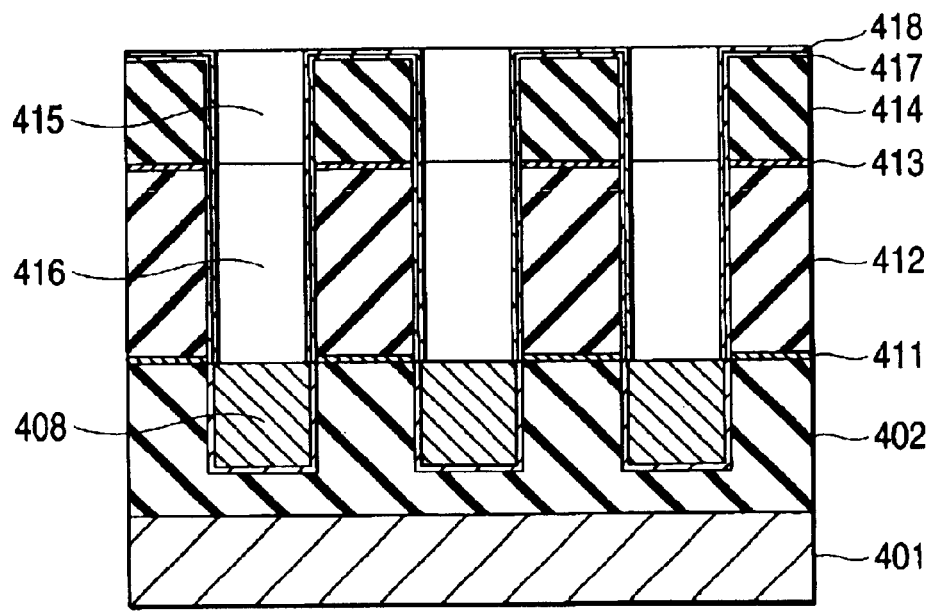

In the next place, as shown in FIG. 4E, the barrier layer 417 and the additive-containing barrier layer 418 on the bottom surface of the via 416, without exposing the sample to air, are removed by means of the anisotropic etching.

Figure 4F:
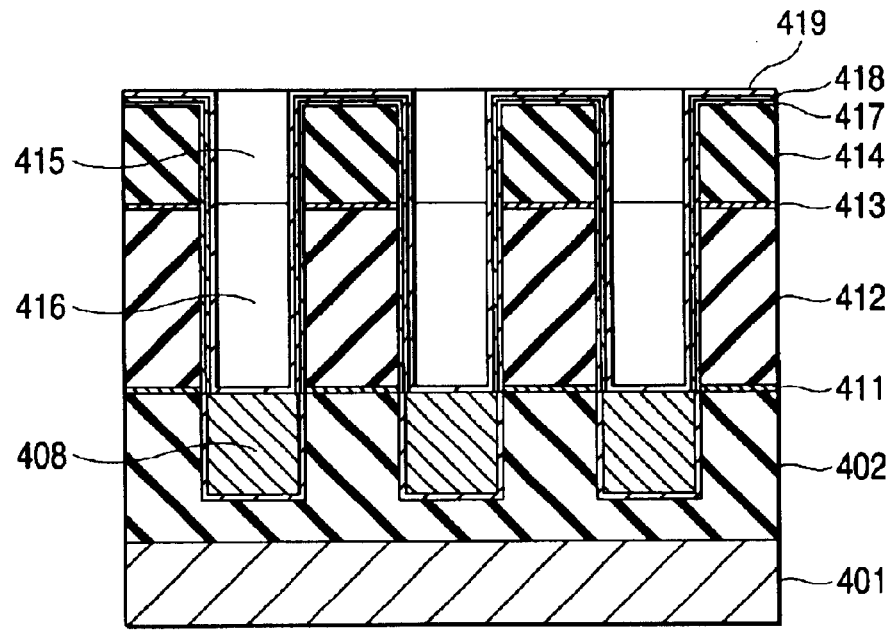

Next, after the barrier layer 417 and the additive-containing barrier layer 418 on the bottom surface of the via 416 are removed, without exposing the sample to air, as shown in FIG. 4F, a Cu seed layer 419 is formed. Since the barrier layer 417 and the additive-containing barrier layer 418 on the bottom surface of the via 416 have been removed, the Cu seed layer 419 is directly connected to the conductive layer 408 that is a lower layer.

Figure 4G:
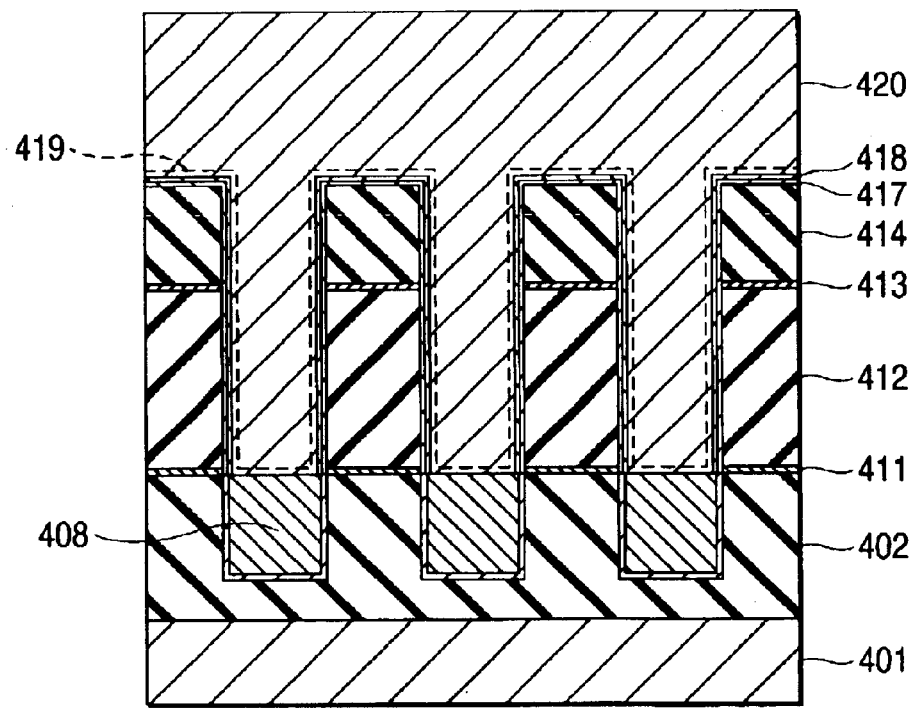

Subsequently, the wafer thereon the Cu seed layer 419 is formed is taken out of the sputtering apparatus, and while exposing to air, transferred to the plating apparatus. Then, as shown in FIG. 4G, on the Cu seed layer 419, a Cu plating layer 420 is formed by use of the electroplating method. The Cu plating layer 420 is formed so that the via 416 and the groove 415 may be completely buried.

Figure 4H:
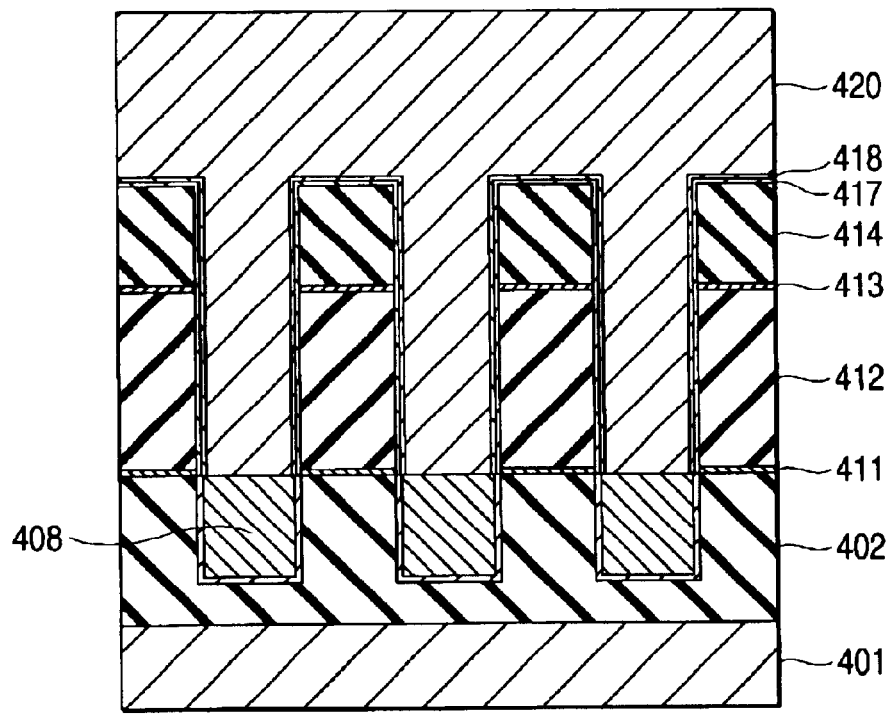
Figure 4I:
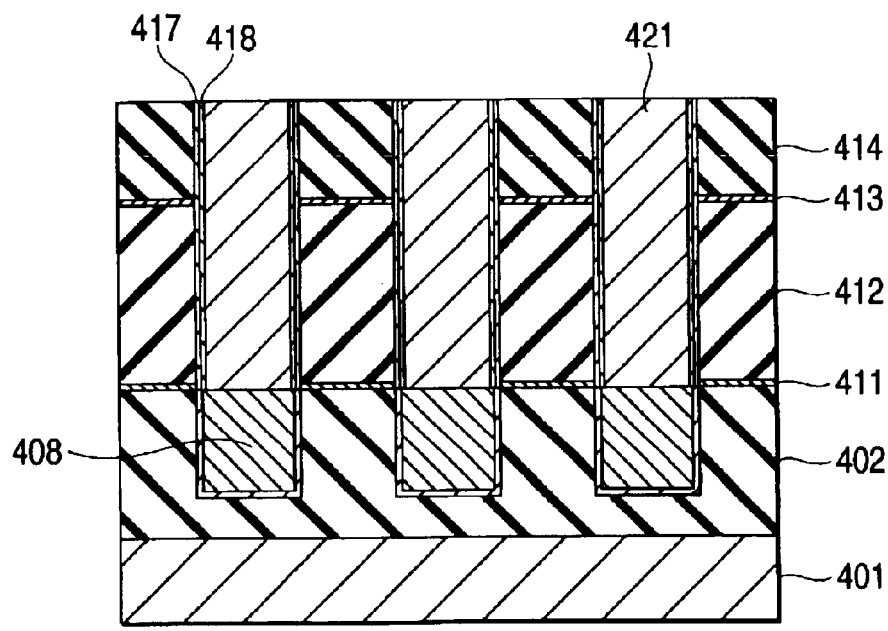

In the next place, in order to stabilize layer qualities such as the hardness, the crystallinity and the specific resistance of the Cu plating layer 420, the heat treatment is carried out at a first temperature (for instance, 100 to 350 degree centigrade) for 1 to 5 hr in an atmosphere of a gas mixture of nitrogen and hydrogen. The most preferable heat treatment temperature differs depending on a width of the layer. Furthermore, the most preferable heat treatment time period differs depending on a width of the layer. In the fourth embodiment, in order to make the diffusion of the additive element from the additive-containing barrier layer 418 to the Cu seed layer 419 and the Cu plating layer 420 as small as possible, the heat treatment is performed at a relatively low temperature, and in order to grow Cu grains of the Cu seed layer 419 and the Cu plating layer 420, the heat treatment is performed for a relatively long time. According to the heat treatment, as shown in FIG. 4H, the Cu seed layer 419 and the Cu plating layer 420 are promoted in integrating.

Figure 4J:
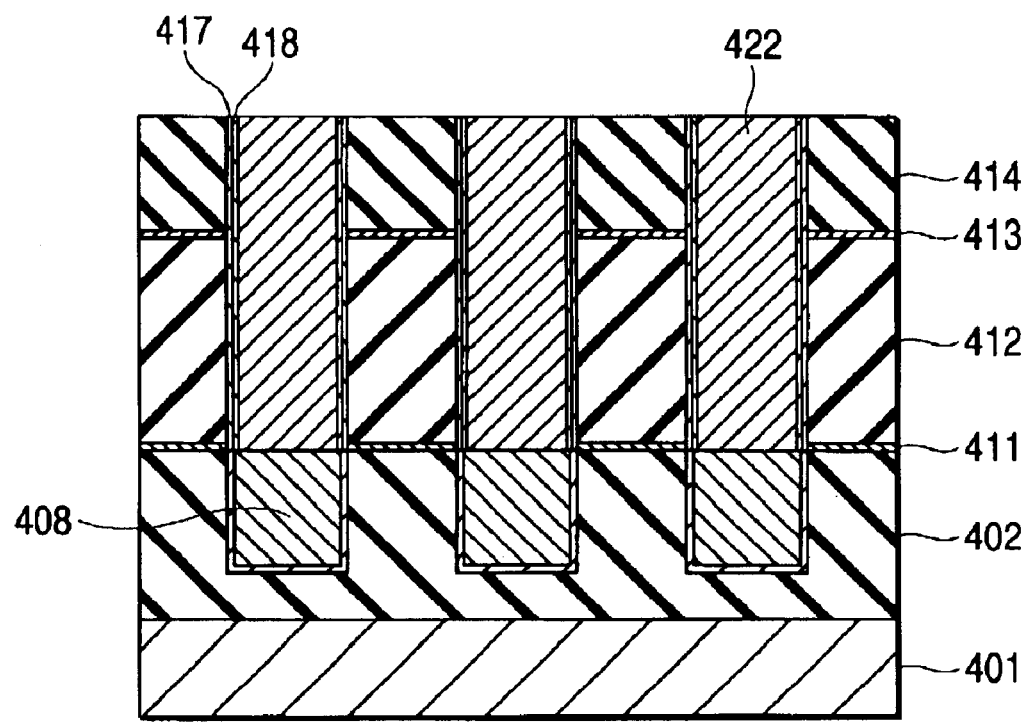

Subsequently, as shown in FIG. 4J, the respective layers on the insulating layer 414, that is, the barrier layer 417, the additive-containing barrier layer 418, the Cu seed layer 419 and the Cu plating layer 420 are partially removed until a top portion of the insulating layer 414 is exposed. The removing is performed according to a CMP polishing method. According to the process, a conductive layer 421 (constituted of part of the Cu seed layer 419 and part of the Cu plating layer 420) is left in the groove 415 and the via 416. The conductive layer 421 is used as a metal layer of a semiconductor element.

In the next place, as shown in FIG. 4J, heat treatment is carried out at a second temperature (for instance, in the neighborhood of 400 degree centigrade) for 0.5 min to 5 hr in nitrogen atmosphere. In the heat treatment, the additive element in the additive-containing barrier layer 418 is diffused into the conductive layer 421 and thereby an additive-containing conductive layer 422 is formed. Accordingly, the second temperature is set higher than the first temperature. Furthermore, the second temperature, without restricting to the neighborhood of 400 degree centigrade, can be a temperature in the range of 250 to 450 degree centigrade. According to the heat treatment, the additive element in the additive-containing barrier layer 418 is allowed to diffuse into the conductive layer 421, and thereby the additive-containing conductive layer 422 is formed. In the above, the formation of the Cu layer in the semiconductor element comes to completion.

As mentioned above, according to the method of forming a metal layer according to the fourth embodiment, after the Cu seed layer 419 is formed in the sputtering apparatus, the wafer is transferred through air to the plating apparatus.

Accordingly, the additive-containing barrier layer 418 is not exposed to the air. As a result, the additive element in the additive-containing barrier layer 418 is not oxidized with the air, and the Cu plating layer 420 can be inhibited from deteriorating in the adhesion and from generating voids when the Cu plating layer 420 is formed.

Furthermore, according to the method of forming a metal layer according to the fourth embodiment, in order to promote grain growth of the Cu seed layer 419 and the Cu plating layer 420, the heat treatment is carried out at the first temperature that is relatively low, and thereafter at the relatively higher second temperature that enables the additive element to diffuse from the additive-containing barrier layer 418 to the conductive layer 421, the heat treatment is implemented. Thus, according to the method of forming a metal layer according to the fourth embodiment, since the grain growth and the diffusion of the additive element that are two countermeasure for improving the EM resistance can be implemented, the Cu layer excellent in the EM resistance can be formed.

Furthermore, since the conductive layer 408 that is a first conductive layer and a second conductive layer 422 are directly connected through the via 416, the layer low in the resistance can be formed, that is, a layer configuration preferable for improving an operation speed of the semiconductor element is obtained.

Still furthermore, in the method of forming the metal layer according to the fourth embodiment, as a under layer of the additive-containing barrier layer 418, the barrier layer 417 is provided. Accordingly, an effect that inhibits the Cu element from diffusing into the insulating layers 412 and 414 can be furthermore enhanced.

Except for the above points, the fourth embodiment is the same as the third embodiment.

As explained above, according to the method of forming a metal layer according to the invention, in order to promote grain growth of a metal seed layer and a metal layer, the heat treatment is carried out at a first temperature that is relatively low, and thereafter at a relatively higher second temperature that enables an additive element to diffuse from an additive-containing barrier layer to a metal layer, the heat treatment is implemented. Thus, according to the methods of forming a metal layer set forth in claims 1 through 9, since the grain growth and the diffusion of the additive element that are two countermeasure for improving the EM resistance can be implemented, there is an effect that a Cu layer excellent in the EM resistance can be formed.

What is claimed is:

1. A method of manufacturing a semiconductor device comprising:
   providing a semiconductor substrate including an insulating layer;
   forming a groove on the insulating layer;
   forming an additive-containing barrier layer on the insulating layer including an inner surface of the groove;
   forming a metal seed layer on the barrier layer;
   forming a metal layer on the metal seed layer so as to bury the groove;
   subjecting the metal layer to a first heat treatment at a first temperature that is capable of promoting grain growth of the metal seed layer and the metal layer;
   partially removing the barrier layer, the metal seed layer and the metal layer so that a conductive layer including the metal seed layer and the metal layer is formed in the groove; and
   subjecting the conductive layer to a second heat treatment at a second temperature that allows an additive element in the barrier layer to diffuse into the metal layer, wherein the second temperature is higher than the first temperature.

2. A method of manufacturing a semiconductor device according to claim 1, wherein the barrier layer is formed of a material selected from a group consisting of TaMgN, TaN, TaCN, TaSiN, TaSiCN, WN, WCN, WSiN, WSiCN, TiN, TiCN, TiSiN, TiSiCN, ZrN, ZrCN, ZrSiN, and ZrSiCN, with at least one or more additive elements selected from a group consisting of Ag, Ca, Zn, Cd, Au, Be, Mg, Sn, Zr, B, Pd, Al, Hg, In, Ni and Ga.

3. A method of manufacturing a semiconductor device according to claim 1, wherein the metal seed layer is a Cu seed layer formed by a sputtering method or a CVD method.

4. A method of manufacturing a semiconductor device according to claim 3, wherein the metal layer is a Cu plating layer formed on the Cu seed layer.

5. A method of manufacturing a semiconductor device according to claim 1, wherein the first temperature is in a range of about 100 to 350 degree centigrade, and wherein the first heat treatment is conducted for a predetermined time period in a range of about 1 minute to 5 hours.

6. A method of manufacturing a semiconductor device according to claim 1, wherein the second temperature is in a range of about 250 to 450 degree centigrade, and wherein the second heat treatment is conducted for a predetermined time period in a range of about 0.5 to 5 hours.

7. A method of manufacturing a semiconductor device according to claim 1, wherein the barrier layer includes a first barrier layer and a second barrier layer formed on the first barrier layer, and wherein the second barrier layer includes an additive-containing.

8. A method of manufacturing a semiconductor device according to claim 7, wherein the first barrier layer is formed of a material selected from a group consisting of TaN, TaCN, TaSiN, TaSiCN, WN, WCN, WSiN, WSiCN, TiN, TiCN, TiSiN, TiSiCN, ZrN, ZrCN, ZrSiN, and ZrSiCN.

9. A method of manufacturing a semiconductor device according to claim 7, wherein the second barrier layer is formed of a material selected from a group consisting of TaN, TaCN, TaSiN, TaSiCN, WN, WCN, WSiN, WSiCN, TiN, TiCN, TiSiN, TiSiCN, ZrN, ZrCN, ZrSiN, and ZrSiCN, with at least one or more additive elements selected from a group consisting of Ag, Ca, Zn, Cd, Au, Be, Mg, Sn, Zr, B, Pd, Al, Hg, In, Ni and Ga.

10. A method of manufacturing a semiconductor device comprising:
   providing a semiconductor substrate;
   forming a first insulating layer having a first metal layer thereon, a cap layer, a second insulating layer, an etch stop layer, and a third insulating layer sequentially on the substrate;
   forming a groove in the third insulating layer;
   forming, at a lower portion of the groove of the third insulating layer, a via that penetrates through the etch stop layer, the second insulating layer, and the cap layer so as to expose the first metal layer;
   forming an additive-containing barrier layer on a side surface of the groove, and on a side surface and a bottom surface of the via;
   removing the additive-containing barrier layer on the bottom surface of the via so as to expose the first metal layer;
   forming a metal seed layer on a surface of the additive-containing barrier layer and on the exposed first metal layer;

forming a second metal layer on a surface of the metal seed layer so as to bury the via and the groove;

subjecting the second metal layer to a first heat treatment at a first temperature that is capable of promoting grain growth of the metal seed layer and the second metal layer;

partially removing the additive-containing barrier layer, the metal seed layer and the metal layer so that a conductive layer including the metal seed layer and the second metal layer is formed in the groove and the via; and subjecting the conductive layer to a second heat treatment at a second temperature that allows an additive element in the barrier layer to diffuse into the second metal layer, wherein the second temperature is higher than the first temperature.

11. A method of manufacturing a semiconductor device according to claim 10, wherein the barrier layer is formed of a material selected from a group consisting of TaMgN, TaN, TaCN, TaSiN, TaSiCN, WN, WCN, WSiN, WSiCN, TiN, TiCN, TiSiN, TiSiCN, ZrN, ZrCN, ZrSiN, and ZrSiCN, with at least one or more additive elements selected from a group consisting of Ag, Ca, Zn, Cd, Au, Be, Mg, Sn, Zr, B, Pd, Al, Hg, In, Ni and Ga.

12. A method of manufacturing a semiconductor device according to claim 10, wherein the metal seed layer is a Cu seed layer formed by a sputtering method or a CVD method.

13. A method of manufacturing a semiconductor device according to claim 12, wherein the metal layer is a Cu plating layer formed on the Cu seed layer.

14. A method of manufacturing a semiconductor device according to claim 10, wherein the first temperature is in a range of about 100 to 350 degree centigrade, and wherein the first heat treatment is conducted for a predetermined time period in a range of about 1 minute to 5 hours.

15. A method of manufacturing a semiconductor device according to claim 10, wherein the second temperature is in a range of about 250 to 450 degree centigrade, and wherein the second heat treatment is conducted for a predetermined time period in a range of about 0.5 to 5 hours.

16. A method of manufacturing a semiconductor device according to claim 10, wherein the barrier layer includes a first barrier layer and a second barrier layer formed on the first barrier layer, and wherein the second barrier layer includes an additive-containing.

17. A method of manufacturing a semiconductor device according to claim 16, wherein the first barrier layer is formed of a material selected from a group consisting of TaN, TaCN, TaSiN, TaSiCN, WN, WCN, WSiN, WSiCN, TiN, TiCN, TiSiN, TiSiCN, ZrN, ZrCN, ZrSiN, and ZrSiCN.

18. A method of manufacturing a semiconductor device according to claim 16, wherein the second barrier layer is formed of a material selected from a group consisting of TaN, TaCN, TaSiN, TaSiCN, WN, WCN, WSiN, WSiCN, TiN, TiCN, TiSiN, TiSiCN, ZrN, ZrCN, ZrSiN, and ZrSiCN, with at least one or more additive elements selected from a group consisting of Ag, Ca, Zn, Cd, Au, Be, Mg, Sn, Zr, B, Pd, Al, Hg, In, Ni and Ga.

19. A method of manufacturing a semiconductor device according to claim 10, wherein the cap layer is a silicon nitride layer.

20. A method of manufacturing a semiconductor device according to claim 10, wherein the etch stop layer is a silicon nitride layer.

* * * * *